(12) United States Patent
Murayama et al.

(10) Patent No.: US 6,864,120 B2
(45) Date of Patent: Mar. 8, 2005

(54) SEMICONDUCTOR DEVICE HAVING A CARBON FIBER REINFORCED RESIN AS A HEAT RADIATION PLATE HAVING A CONCAVE PORTION

(75) Inventors: Kei Murayama, Nagano (JP); Mitsutoshi Higashi, Nagano (JP); Hideaki Sakaguchi, Nagano (JP); Hiroko Koike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/777,232

(22) Filed: Feb. 12, 2004

(65) Prior Publication Data

US 2004/0166609 A1 Aug. 26, 2004

Related U.S. Application Data (62) Division of application No. 09/760,396, filed on Jan. 12, 2001, now Pat. No. 6,713,863.

(30) Foreign Application Priority Data

Jan. 24, 2000 (JP) ........................................ 2000-014809

(51) Int. Cl.[7] .......................... H01L 21/44; H01L 21/48; H01L 21/50
(52) U.S. Cl. ........................ 438/106; 438/108; 438/118; 438/122; 438/127
(58) Field of Search ............................... 438/106, 108, 438/122

(56) References Cited

U.S. PATENT DOCUMENTS

| | | | | |
|---|---|---|---|---|
| 5,523,260 A | * | 6/1996 | Missele | 156/330 |
| 5,834,337 A | * | 11/1998 | Unger et al. | 438/122 |
| 6,093,961 A | * | 7/2000 | McCullough | 257/718 |
| 6,215,180 B1 | * | 4/2001 | Chen et al. | 257/720 |
| 6,271,058 B1 | * | 8/2001 | Yoshida | 438/108 |
| 6,288,900 B1 | * | 9/2001 | Johnson et al. | 361/705 |
| 6,660,566 B2 | * | 12/2003 | Masayuki | 438/124 |
| 6,670,223 B2 | * | 12/2003 | Gaynes et al. | 438/118 |
| 6,727,422 B2 | * | 4/2004 | Macris | 136/201 |
| 2003/0001258 A1 | * | 1/2003 | Kodama et al. | 257/727 |

* cited by examiner

*Primary Examiner*—John F. Niebling
*Assistant Examiner*—Angel Roman
(74) *Attorney, Agent, or Firm*—Ladas & Parry LLP

(57) ABSTRACT

A semiconductor device comprises a substantially flat interconnection substrate having an interconnection pattern formed on a surface thereof. A semiconductor element is mounted on the substantially flat interconnection substrate so that an electrode terminal of the semiconductor element is electrically connected to the interconnection pattern. A heat radiation plate is formed in a form of a sheet having a concave portion so as to cover the semiconductor element and is bonded on the surface of the substantially flat interconnection substrate. An external connection terminal is formed on the other surface of the substantially flat interconnection substrate so as to penetrate through the substantially flat interconnection substrate and be electrically connected to the interconnection pattern. The heat radiation plate is formed of a heat-resistant resin containing carbon fibers.

2 Claims, 6 Drawing Sheets

SEMICONDUCTOR DEVICE HAVING A CARBON FIBER REINFORCED RESIN AS A HEAT RADIATION PLATE HAVING A CONCAVE PORTION

This application is a division of U.S. Ser. No. 09/760,396 filed Jan. 12, 2001 now U.S. Pat. No. 6,713,863, which U.S. application is hereby incorporated herein by reference.

BACKGROUND OF THE INVENTION

1. Field of the Invention

The present invention generally relates to a semiconductor device and a manufacturing method thereof and, more particularly, to a technology which can miniaturize and lighten a semiconductor device comprising a package structure, such as a BGA (Ball Grid Array) or a PGA (Pin Grid Array), and a heat radiation structure.

2. Description of the Related Art

Recently, as a semiconductor element (LSI chip) mounted on a package of a semiconductor device has been improved to present high performance, the semiconductor device is required to operate at high-speed. However, as the speed increases, more heat is produced during a circuit operation, causing an inconvenience of decreased reliability of the circuit operation.

Figure 1A:
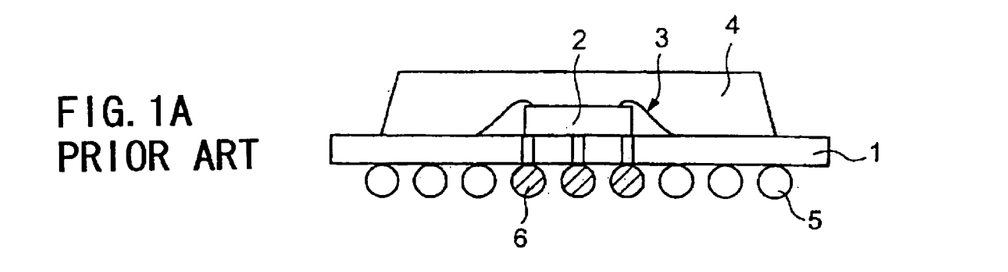
FIG. 1A is an illustration for explaining problems of a semiconductor device according to a conventional technology.
Figure 1B:
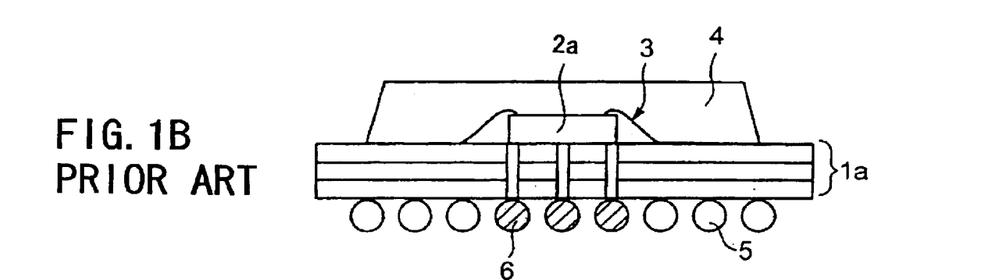
FIG. 1B is an illustration for explaining problems of another semiconductor device according to the conventional technology.
Figure 1C:
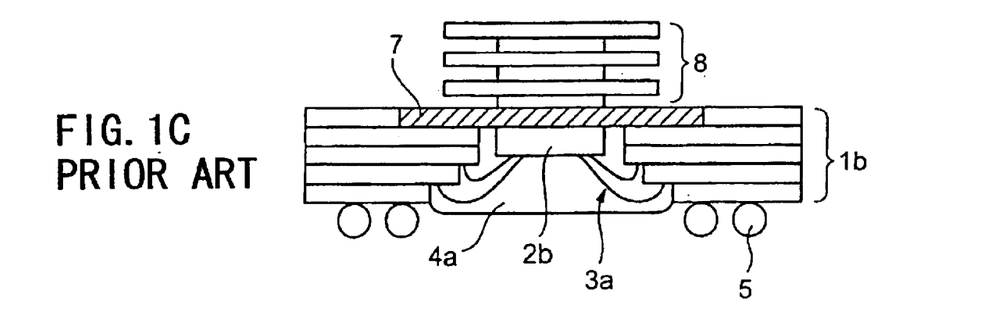
FIG. 1C is an illustration for explaining problems of still another semiconductor device according to the conventional technology.

As a countermeasure to this, a typical semiconductor device according to a conventional technology has a heat radiation structure to emit heat generated from the semiconductor chip to the exterior of the package. FIG. 1A to FIG. 1C show examples of a semiconductor device having this structure.

FIG. 1A is an illustration of a structure of a semiconductor device comprising: a plastic BGA (package) having an interconnection substrate formed of a resin (plastic) and a metal bump formed thereon as an external connection terminal; and a semiconductor chip, of not remarkably high performance and of a currently mass-produced type, mounted on the plastic BGA. FIG. 1B is an illustration of a structure of a semiconductor device comprising: a plastic BGA (package) having an interconnection substrate formed of a resin (plastic) and a metal bump formed thereon as an external connection terminal; and a semiconductor chip, faster and more power-consuming than the semiconductor chip shown in FIG. 1A, mounted on the plastic BGA. FIG. 1C is an illustration of a structure of a semiconductor device comprising: a plastic BGA (package) having an interconnection substrate formed of a resin (plastic) and a metal bump formed thereon as an external connection terminal; and a semiconductor chip, of even higher performance than the semiconductor chip shown in FIG. 1B, mounted on the plastic BGA.

In FIG. 1A, a semiconductor chip 2 is mounted on one surface of an interconnection substrate 1 so that a surface of the semiconductor chip 2 opposite to a side where an electrode terminal thereof is formed is bonded on the surface of the interconnection substrate 1. The electrode terminal of the semiconductor chip 2 is electrically connected to an interconnection pattern formed on the interconnection substrate 1 in a predetermined manner through a bonding wire 3. A sealing resin 4 covers and seals the semiconductor chip 2 and the bonding wire 3. On the other surface of the interconnection substrate 1 is formed a solder bump 5 which is used as an external connection terminal for the semiconductor chip 2. In addition, on the other surface of the interconnection substrate 1 is formed a solder bump 6 which is used as a terminal to radiate heat generated from the semiconductor chip 2. The heat radiation terminal (solder bump 6) penetrates through the interconnection substrate 1 and is thermally connected to the semiconductor chip 2. Likewise, though not particularly shown in the figure, the external connection terminal (solder bump 5) penetrates through the interconnection substrate 1 and is electrically connected to the interconnection pattern formed on the interconnection substrate 1.

With respect to the structure shown in FIG. 1A, the interconnection patterns can be formed on both surfaces of the interconnection substrate 1, providing a two-layer structure. However, such a two-layer structure is still insufficient for mounting thereon a semiconductor chip that requires a further high-speed operation.

As shown in FIG. 1B, to adapt to such a high-speed operation, an interconnection substrate 1a is constructed to have a four-layer structure which may achieve inhibition of a switching noise during a circuit operation in a semiconductor chip 2a; and a decrease in thermal resistance. This structure also has the heat radiation terminal (solder bump 6) as a heat radiation structure to radiate heat generated from the semiconductor chip 2a.

As shown in FIG. 1C, to adapt to even higher performance, an interconnection substrate 1b is constructed to have a six-layer structure. A heat spreader 7, which is a highly thermally conductive metal plate, such as copper (Cu) or aluminum (Al), is bonded on the backside (the opposite surface to where an electrode terminal of a semiconductor chip 2b is formed) of the semiconductor chip 2b placed inside a cavity formed in a middle part of the interconnection substrate 1b so as to further reduce the thermal resistance. Still more, a heat sink 8 formed of a material such as a metal or a ceramic, is mounted on the heat spreader 7 so as to enhance heat radiation effect. The electrode terminal of the semiconductor chip 2b bonded to the heat spreader 7 is electrically connected to an interconnection pattern formed on each layer of the interconnection substrate 1b through a bonding wire 3a. A sealing resin 4a covers and seals the semiconductor chip 2b and the bonding wire 3a.

The above-mentioned semiconductor devices according to the conventional technology have disadvantages. For example, in the structures shown in FIG. 1A and FIG. 1B, the heat generated from the semiconductor chip 2 or 2a is only radiated from the underside of the package (interconnection substrate 1 or interconnection substrate 1a) through a limited number of the heat radiation terminals (solder bumps 6). Thus, these structures are not sufficient in terms of heat radiation effect.

To solve this problem, the number of the heat radiation terminals 6 may be increased, as a countermeasure. However, since the package is constructed in a specified size, the increase in number of the heat radiation terminals 6 leads to a relative decrease in number of the external connection terminals (solder bumps 5), which poses more serious problems on the semiconductor device. Consequentially, the number of the heat radiation terminals 6 is limited, undermining this countermeasure.

On the other hand, in the structure shown in FIG. 1C, since the heat radiation structures (heat spreader 7 and heat sink 8) are thermally connected with the semiconductor chip 2b, the heat generated from the semiconductor chip 2b is effectively radiated from the upper side of the package (interconnection substrate 1b) through these heat radiation structures 7 and 8. The heat generated from the semiconductor chip 2b is also radiated from the underside of the package (interconnection substrate 1b) through the sealing resin 4a and the air between the sealing resin 4a and a mounting substrate, such as a motherboard (not shown in the figure). Therefore, this structure is advantageous in terms of the heat radiation effect, compared to the structures shown in FIG. 1A and FIG. 1B.

However, this structure shown in FIG. 1C also has a disadvantage. That is, since a metal plate, such as copper (Cu) or aluminum (Al), or a material such as a ceramic is used as the heat radiation structures (heat spreader 7 and heat sink 8), the whole package becomes relatively large and heavy. Especially when considering the recently increasing needs toward miniaturization and lightening of the semiconductor packages, this disadvantage still has to be improved.

SUMMARY OF THE INVENTION

It is a general object of the present invention to provide an improved and useful semiconductor device and a manufacturing method thereof in which the above-mentioned problems are eliminated.

A more specific object of the present invention is to provide a semiconductor device which can be miniaturized (thinned down) and lightened while maintaining an expected heat radiation effect, and a manufacturing method thereof.

In order to achieve the above-mentioned objects, there is provided according to one aspect of the present invention a semiconductor device comprising:

a substantially flat interconnection substrate having an interconnection pattern formed on a surface thereof;

a semiconductor element mounted on the substantially flat interconnection substrate so that an electrode terminal of the semiconductor element is electrically connected to the interconnection pattern;

a heat radiation plate formed in a form of a sheet having a concave portion so as to cover the semiconductor element and bonded on the surface of the substantially flat interconnection substrate; and an external connection terminal formed on the other surface of the substantially flat interconnection substrate so as to penetrate through the substantially flat interconnection substrate and be electrically connected to the interconnection pattern, wherein the heat radiation plate is formed of a heat-resistant resin containing carbon fibers.

In order to achieve the above-mentioned objects, there is also provided according to another aspect of the present invention a manufacturing method of a semiconductor device, the method comprising:

a first step of preparing a heat-resistant resin containing carbon fibers in a form of a prepreg having a shape corresponding to an outline of a package;

a second step of molding the heat-resistant resin into a predetermined shape by heating and pressurizing the heat-resistant resin in a mold having a shape corresponding to an outline of a semiconductor element to be mounted;

a third step of mounting the semiconductor element on a substantially flat interconnection substrate having an interconnection pattern formed on a surface thereof so that an electrode terminal formed on a surface of the semiconductor element is electrically connected to the interconnection pattern;

a fourth step of applying an adhesive on a surface of the semiconductor element opposite to the surface on which the electrode terminal is formed and on the surface of the substantially flat interconnection substrate;

a fifth step of heating and pressurizing the heat-resistant resin placed on the surface of the substantially flat interconnection substrate in a mold having a shape corresponding to an outline of the package; and a sixth step of forming an external connection terminal on the other surface of the substantially flat interconnection substrate so as to penetrate through the substantially flat interconnection substrate and be electrically connected to the interconnection pattern.

In order to achieve the above-mentioned objects, there is also provided according to still another aspect of the present invention a manufacturing method of a semiconductor device, the method comprising:

a first step of preparing a heat-resistant resin containing carbon fibers in a form of a prepreg having a shape corresponding to an outline of a package;

a second step of mounting a semiconductor element on a surface of a substantially flat interconnection substrate having an interconnection pattern formed on the surface thereof so that an electrode terminal of the semiconductor element is electrically connected to the interconnection pattern;

a third step of molding the heat-resistant resin into a predetermined shape and bonding the heat-resistant resin on the surface of the substantially flat interconnection substrate by heating and pressurizing the heat-resistant resin placed on the surface of the substantially flat interconnection substrate in a mold having a shape corresponding to an outline of the package; and a fourth step of forming an external connection terminal on the other surface of the substantially flat interconnection substrate so as to penetrate through the substantially flat interconnection substrate and be electrically connected to the interconnection pattern.

According to the present invention, the heat-resistant, molded resin containing the carbon fibers is used as the heat radiation plate in the form of a sheet having a concave portion to radiate heat generated from the semiconductor element. Therefore, while the expected heat radiation effect is maintained, the semiconductor device can be miniaturized (thinned down) and lightened, compared to the conventional technology which uses such a material as a metal plate, such as a Cu or Al plate, for heat radiation.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 2:
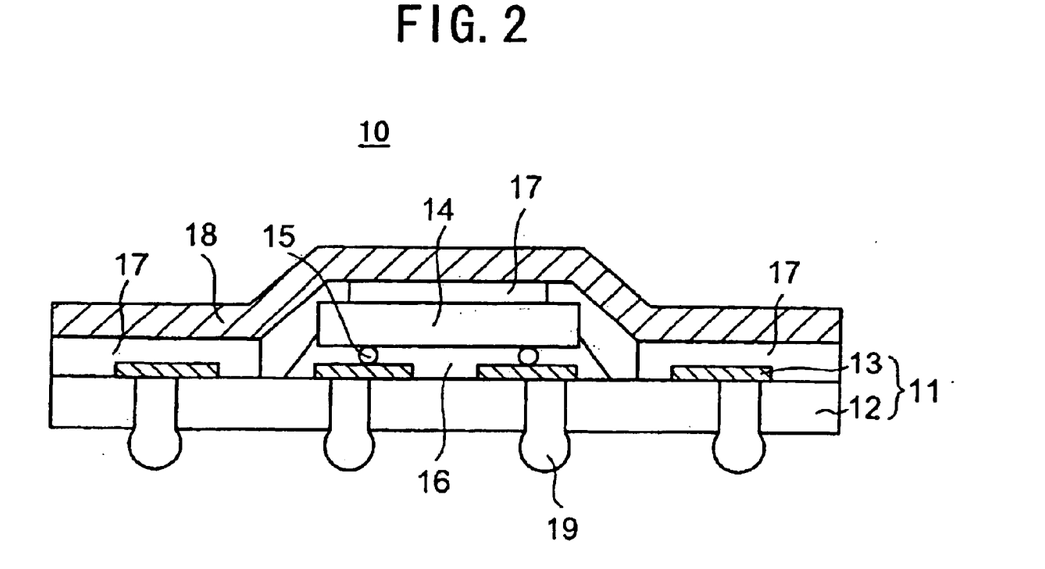
FIG. 2 is a cross-sectional view of a structure of a semiconductor device according to an embodiment of the present invention.

FIG. 2 is a cross-sectional view of a structure of a semiconductor device according to an embodiment of the present invention.

The semiconductor device 10 according to the present embodiment basically comprises a substantially flat interconnection substrate 11 provided as a semiconductor package, a semiconductor element (chip) 14 mounted thereof, a heat radiation plate 18 in the form of a sheet having a concave portion applied to the interconnection substrate 11 so as to cover the semiconductor chip 14, and a solder bump 19 provided as an external connection terminal of the semiconductor device 10.

The interconnection substrate 11 comprises an interconnection pattern 13 formed in a predetermined shape on one surface (upper surface in FIG. 2) of an insulating base 12. The solder bump (external connection terminal) 19 is formed on the other surface (under surface in FIG. 2) of the insulating base 12 so that the solder bump 19 is connected to the interconnection pattern 13 through the insulating base 12. The solder bump 19 is used to mount the semiconductor device 10 on a mounting substrate such as a motherboard.

In FIG. 2, the interconnection pattern 13 is formed only on one side of the interconnection substrate 11. However, not limited to this example, the interconnection pattern 13 may be formed on each side of the interconnection substrate 11. In this case, it should be noted that, since the interconnection pattern 13 formed on the under side of the interconnection substrate 11 is exposed, a protective coat such as a solder resist needs to be formed to protect outwardly the interconnection pattern 13 on the under side.

As the interconnection substrate 11, an insulating resin film is used, such as a polyimide resin film or an epoxy resin film, on a surface of which an interconnection pattern made of copper (Cu) is formed. As a specific example, a TAB tape comprising the polyimide resin film and a copper (Cu) foil formed on one surface thereof by patterning can be used.

The semiconductor chip 14 is mounted by flip chip bonding so that an electrode terminal 15 thereof is electrically connected to the interconnection pattern 13 of the interconnection substrate 11. In the present embodiment, ACF bonding, which uses an anisotropic conductive film (ACF) 16, is employed as this flip chip bonding. As the ACF 16, a thermosetting resin, such as an epoxy resin film containing electrically conductive particles such as silver (Ag) fillers, is used.

An adhesive 17 bonds the heat radiation plate 18 to the interconnection substrate 11. In FIG. 2, the adhesive 17 is applied to each of the interconnection substrate 11 on the side of the interconnection pattern 13 and the backside (the opposite side to the electrode terminal 15) of the semiconductor chip 14. As the adhesive 17, an insulating material such as a thermosetting resin, or an electrically conductive material such as an Ag paste is used according to each occasion, as mentioned hereinafter.

In the present embodiment, in order to thin down the semiconductor device 10, the semiconductor chip 14 as thin as possible is used. In current technology, semiconductor chips approximately 50 to 100 $\mu$m thick are provided. Such semiconductor chips can be mounted with certain techniques. In consideration of this situation, the semiconductor chip 14 as thin as approximately 50 $\mu$m is used in the present embodiment.

The semiconductor device 10 according to the present embodiment is characterized in that the heat radiation plate 18 in the form of a sheet having a concave portion is formed of a heat-resistant, molded resin containing carbon fibers. Such a resin reinforced with carbon fibers as this is referred to as a CFRP (Carbon Fiber Reinforced Plastic) hereinafter. The heat radiation plate 18 is formed of an adhesive sheet hardened through heating and pressurizing processes, in which is hardened a semihard adhesive sheet in a B-stage (i.e., a CFRP in the form of a prepreg) formed by impregnating a reinforcing material, such as a PAN-based carbon fiber based on a polyacrylonitrile (PAN) or a pitch-based carbon fiber based on a pitch obtained in distilling such a material as a coal tar, with a thermosetting resin such as an epoxy resin.

Figure 3A:
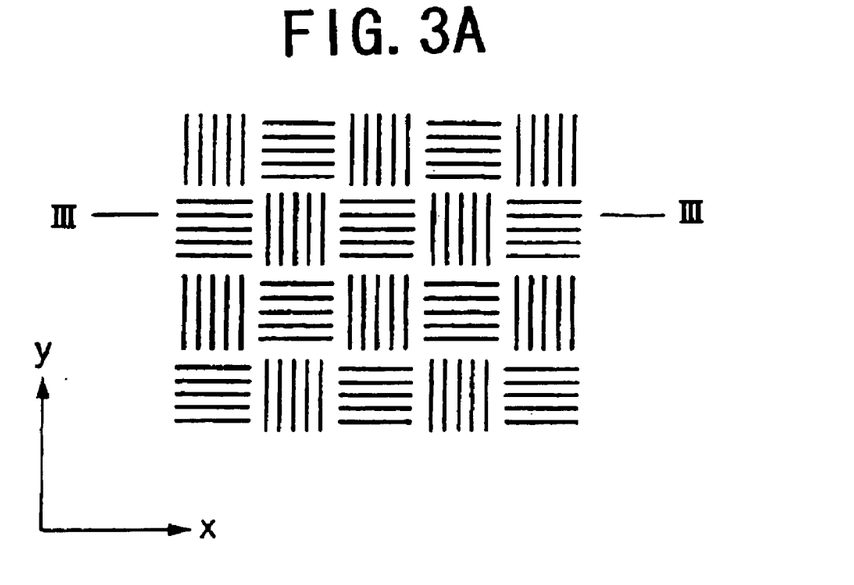
FIG. 3A is a plan view of a structure of carbon fibers of a CFRP (a heat radiation plate) shown in FIG. 2.
Figure 3B:
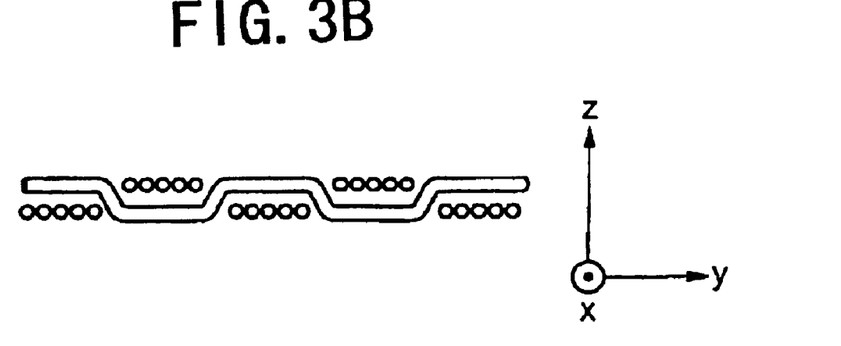
FIG. 3B is a cross-sectional view of the structure taken along a line III—III in FIG. 3A.

This heat radiation plate 18 in the form of a sheet (i.e., a CFRP hardened and molded) is devised to function effectively. FIG. 3A and FIG. 3B show an example of this.

FIG. 3A is a plan view of a structure of carbon fibers of the CFRP (the heat radiation plate 18). FIG. 3B is a cross-sectional view of the structure taken along a line III—III in FIG. 3A.

A reinforcing material of the CFRP (the heat radiation plate 18) is formed by weaving carbon fibers so that the carbon fibers extend in directions x and y (i.e., directions parallel to a surface of the interconnection substrate 11), as shown in FIG. 3A and FIG. 3B. In a case of using, for example, the PAN-based carbon fiber as a carbon fiber, a coefficient of thermal conductivity in the directions x and y is 40 to 45 W/m·K. On the other hand, a coefficient of thermal conductivity in a perpendicular direction (direction z) to the directions x and y is merely 1 to 2 W/m·K. That is, the coefficient of thermal conductivity in the directions x and y, in which the carbon fibers extend, is relatively large. Therefore, by weaving the carbon fibers so that the carbon fibers extend in the directions x and y as shown in FIG. 3A and FIG. 3B, the heat radiation plate 18 can function effectively.

It should be noted that, although the carbon fibers are woven so that the carbon fibers extend in both of the directions x and y in FIG. 3A and FIG. 3B, the carbon fibers may be woven so that the carbon fibers extend in either of the directions x or y. Further, the carbon fibers may be woven so that the carbon fibers extend in an arbitrary direction in a plane x and y.

Figure 4:
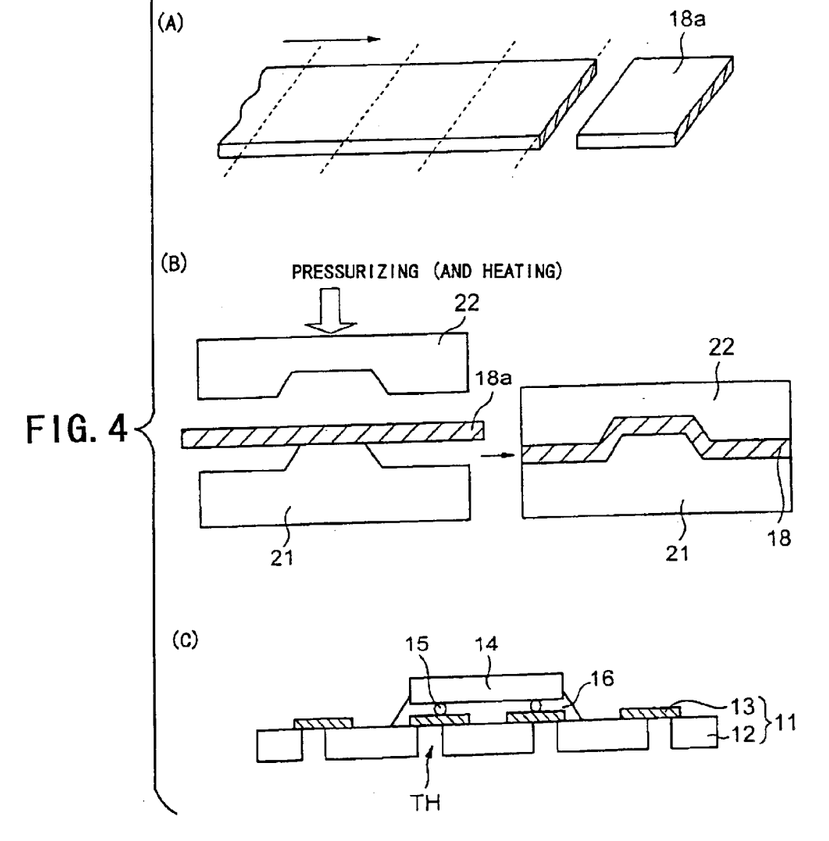
FIG. 4 is a cross-sectional view showing steps of a manufacturing method of the semiconductor device shown in FIG. 2.
Figure 5:
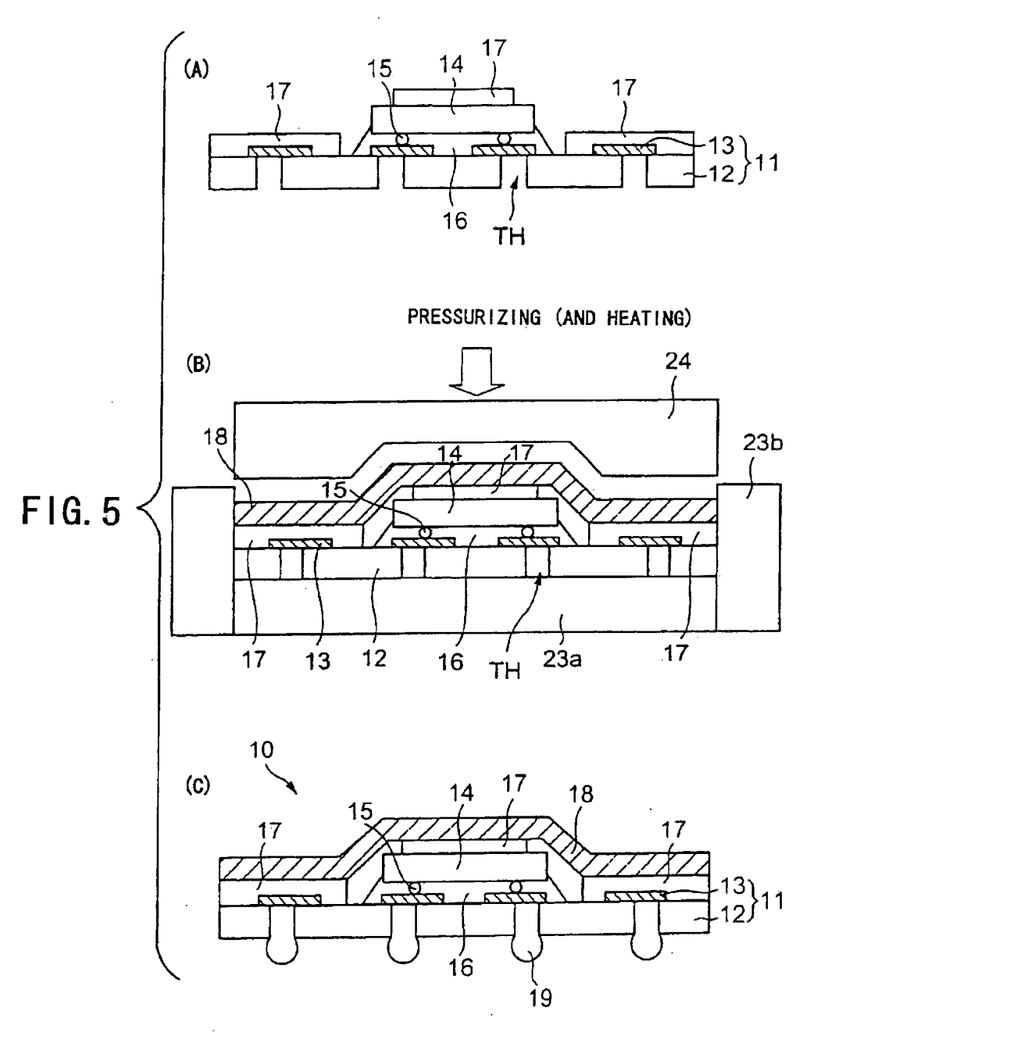
FIG. 5 is a cross-sectional view showing steps succeeding the steps shown in FIG. 4.

Next, a description will be given, with reference to FIG. 4 and FIG. 5, of an example of manufacturing the semiconductor device 10 according to the present embodiment. FIG. 4 is a cross-sectional view showing steps of a manufacturing method of the semiconductor device 10. FIG. 5 is a cross-sectional view showing steps succeeding the steps shown in FIG. 4.

In the first step, shown in FIG. 4-(A), a CFRP 18a in the form of a prepreg, having a shape according to an outer shape of the package (substantially flat interconnection substrate) 11, is prepared.

The CFRP 18a is formed, for example, by cutting a CFRP in predetermined length units, as shown by broken lines in FIG. 4-(A), in the course of unrolling a roll of the CFRP (not shown in the figure) rolled up beforehand in a predetermined width and carrying in the unrolled CFRP, as shown by an arrow in FIG. 4-(A).

The reinforcing material of the CFRP 18a is formed by weaving carbon fibers so that the carbon fibers extend in a plurality of directions parallel to a surface of the interconnection substrate 11, as shown in FIG. 3A and FIG. 3B.

In the next step shown in FIG. 4-(B), the CFRP 18a is molded by using an under mold 21 having a convex shape corresponding to an outline which is to cover the semiconductor chip 14 to be mounted and an upper mold 22 having a concave shape that fits the convex shape of the under mold 21. That is, the CFRP 18a is placed on the under mold 21 and pressurized as shown by an arrow in FIG. 4-(B) by using the upper mold 22, while being heated at a temperature of approximately 150° C. Thereby, the CFRP 18a is hardened in a predetermined shape, such as of a cap. The CFRP molded as above (i.e., the heat radiation plate 18 in the form of a sheet) is selectively 100-μm thick approximately.

Thereafter, the molded heat radiation plate 18 is retrieved from the under mold 21 and the upper mold 22.

In the next step shown in FIG. 4-(C), the semiconductor chip 14 is mounted on the substantially flat interconnection substrate 11 having the interconnection pattern 13 formed on one side thereof so that the electrode terminal 15 formed of a gold (Au) bump is electrically connected with the interconnection pattern 13. This mounting is performed by using the flip chip bonding. More specifically, the ACF bonding, which uses the anisotropic conductive film (ACF) 16, is employed as this flip chip bonding. As the semiconductor chip 14, a semiconductor chip as thin as approximately 50 μm is used, as mentioned above.

The substantially flat interconnection substrate 11 can be constructed as follows. First, a polyimide resin film (the insulating base 12) having an adhesive layer (not shown in the figure) is prepared. The polyimide resin film is approximately 20 μm in thickness. Then, a through hole TH is formed at a predetermined portion in the polyimide resin film by laser machining or press working. Next, a copper (Cu) foil approximately 12 μm thick is applied on the polyimide resin film by thermal press bonding using the adhesive layer. Thereafter, the copper (Cu) foil is formed into the interconnection pattern 13 by photoetching.

It should be noted that the step of mounting the semiconductor chip 14 shown in FIG. 4-(C) and the steps of cutting and molding (hardening) the CFRP 18a in the form of a prepreg into the heat radiation plate 18 in the form of a sheet shown in FIG. 4-(A) and FIG. 4-(B) can be reversed in order.

In the next step shown in FIG. 5-(A), the adhesive 17 is applied to each of the interconnection substrate 11 on the side where the interconnection pattern 13 is formed and the backside (the opposite side to the electrode terminal 15) of the semiconductor chip 14.

As the adhesive 17, an insulating material or an electrically conductive material is used, as mentioned above. In case of using the electrically conductive material, the structure has to be arranged so that the interconnection pattern 13 for signal use does not short-circuit electrically. For example, in a case of using the heat radiation plate 18 also as a ground plane, an electrically conductive adhesive should be used between the backside of the semiconductor chip 14 and the heat radiation plate 18 and also between the interconnection pattern 13 for ground use and the heat radiation plate 18, while an insulating adhesive should be used for other parts.

In the next step shown in FIG. 5-(B), the molded CFRP (the heat radiation plate 18 in the form of a sheet) is bonded on the interconnection substrate 11 by using an under mold (comprising a bottom half 23a and a side half 23b) having a concave shape corresponding to an outline of the package and a concave-shaped upper mold 24 which is to be inserted into an opening of the under mold 23a and 23b. That is, the interconnection substrate 11 is placed in the opening of the under mold 23a and 23b so that the side where the adhesive 17 is applied faces upward. Then, the heat radiation plate 18 in the form of a sheet is placed further on the interconnection substrate 11. Next, the upper mold 24 is used to pressurize the interconnection substrate 11 and the heat radiation plate 18 as shown by an arrow in FIG. 5-(B), while being heated at a temperature of approximately 150° C. Thereby, the molded heat radiation plate 18 in the form of a sheet is bonded on the interconnection substrate 11.

Thereafter, the interconnection substrate 11 bonded to the heat radiation plate 18 is retrieved from the under mold 23a and 23b and the upper mold 24.

In the final step shown in FIG. 5-(C), the solder bump (external connection terminal) 19 is formed on the other side of the interconnection substrate 11 (a side opposite to the side to which the heat radiation plate 18 is bonded) so as to be electrically connected with the interconnection pattern 13 of the interconnection substrate 11.

That is, a solder ball approximately 300 μm in diameter is disposed in the through hole TH formed in the interconnection substrate 11 and then is bonded therein by reflowing. Thereby, the solder ball fills up the through hole TH and is electrically connected to the interconnection pattern 13, forming the solder bump 19 protruding as a ball from the bottom surface of the insulating base 12.

It is preferred, though not shown in the figure, that a conductive membrane be formed on the inner wall of the through hole TH by such a method as copper (Cu) plating, prior to disposing the solder ball in the through hole TH, so as to increase a wettability of the solder.

As mentioned above, according to the semiconductor device 10 and the manufacturing method thereof in the present embodiment, the CFRP in the form of the sheet is used as the heat radiation plate 18 to radiate heat generated from the semiconductor chip 14. Therefore, while the expected heat radiation effect is maintained, the semiconductor device 10 can be miniaturized (thinned down) and lightened, compared to the conventional technology shown in FIG. 1C which uses such a material as a metal plate, such as a Cu or Al plate, for heat radiation.

In addition, since the carbon fibers of the CFRP (the heat radiation plate 18) are woven so that the carbon fibers extend in the directions x and y (i.e., the directions parallel to a surface of the interconnection substrate 11) in which the coefficient of thermal conductivity is relatively large, the heat can be effectively radiated.

In the manufacturing method according to the present embodiment, after the CFRP 18a in the form of a prepreg is cut into a predetermined shape, the CFRP 18a is molded (hardened) through the heating and pressurizing processes into the heat radiation plate 18. Reversing these steps of cutting and molding in order causes inconvenience. That is, if the step of cutting is performed after the step of molding, the cut edge surfaces of the CFRP produce carbon powders so as to taint the CFRP. According to the present embodiment, even if such carbon powders are produced in the step of cutting, the cut edge surfaces of the CFRP 18a are covered with a resin in the following heating process. Thus such an inconvenience is not caused.

In the above-mentioned embodiment, the manufacturing method of the semiconductor device 10 is described as the steps of molding the CFRP 18a in a prepreg form into a predetermined shape (the heat radiation plate 18); and then bonding the heat radiation plate 18 on the interconnection substrate 11 having the semiconductor chip 14 mounted thereon. That is, in this method, the step of molding the CFRP 18a and the step of bonding the heat radiation plate 18 on the interconnection substrate 11 are separated. However, the manufacturing method of the semiconductor device 10 is not limited to this embodiment.

Figure 6:
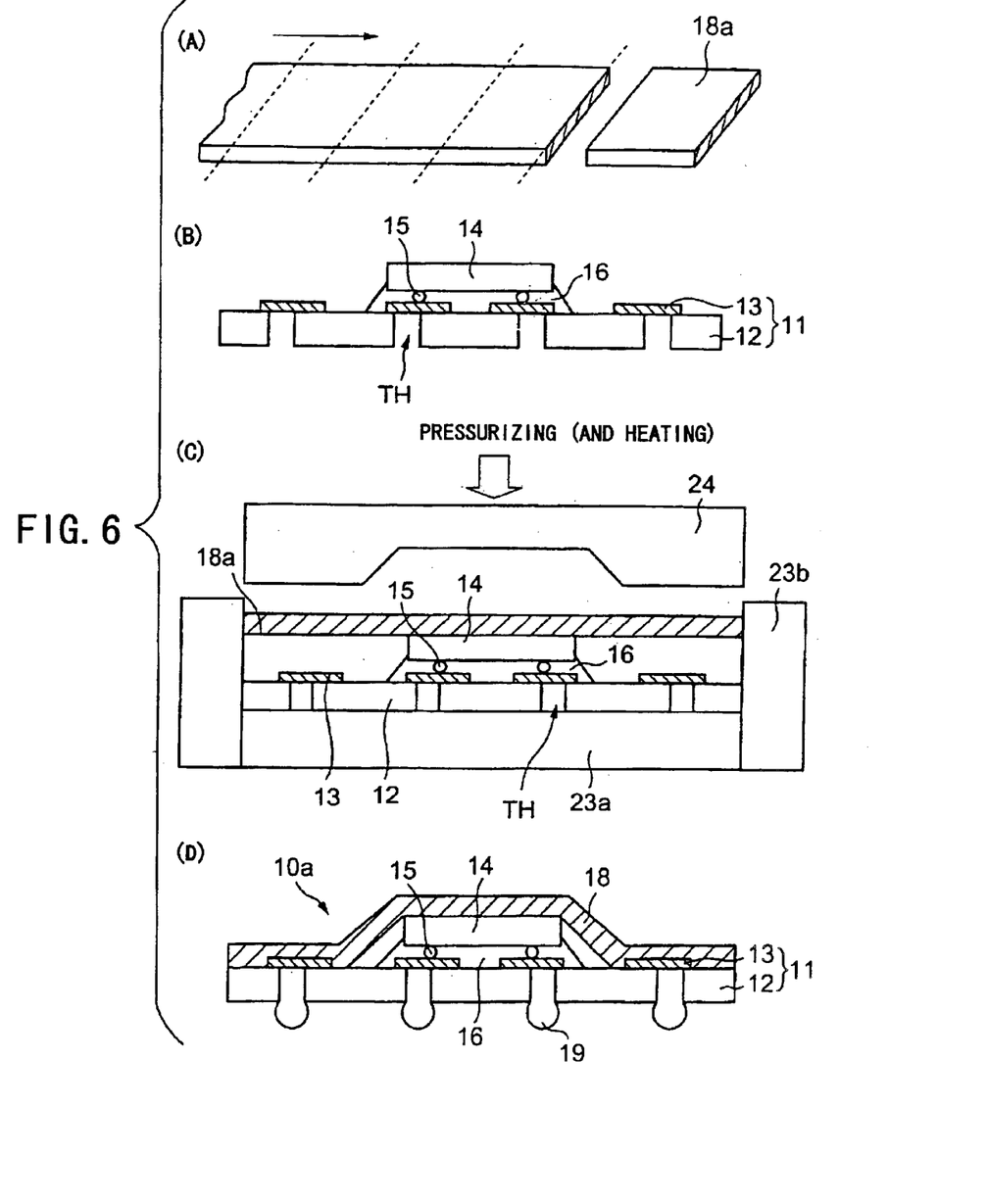
FIG. 6 is a cross-sectional view showing steps of another manufacturing method of the semiconductor device shown in FIG. 2.

For example, the CFRP 18a in a prepreg form may be molded into a predetermined shape, while being bonded onto the interconnection substrate 11 having the semiconductor chip 14 mounted thereon. FIG. 6 shows such an example of a manufacturing method of the semiconductor device 10.

In the first step shown in FIG. 6-(A), the CFRP 18a in the form of a prepreg, having the shape according to the outer shape of the package (substantially flat interconnection substrate) 11, is prepared, as in the step shown in FIG. 4-(A).

In the next step shown in FIG. 6-(B), the semiconductor chip 14 is mounted on the interconnection substrate 11 by the ACF bonding so that the electrode terminal 15 of the semiconductor chip 14 is electrically connected with the interconnection pattern 13, as in the step shown in FIG. 4-(C).

It should be noted that the step of mounting the semiconductor chip 14 shown in FIG. 6-(B) and the step of preparing the CFRP 18a in the form of a prepreg shown in FIG. 6-(A) can be reversed in order.

In the next step shown in FIG. 6-(C), the CFRP 18a in the form of a prepreg is molded and bonded on the interconnection substrate 11 at the same time, by using the under mold (comprising the bottom half 23a and the side half 23b) having a concave shape corresponding to an outline of the package and the concave-shaped upper mold 24 which is to be inserted into the opening of the under mold 23a and 23b. That is, the interconnection substrate 11 is placed in the opening of the under mold 23a and 23b so that the side where the semiconductor chip 14 is mounted faces upward. Then, the CFRP 18a in the form of a prepreg is placed further on the interconnection substrate 11. Next, the upper mold 24 is used to pressurize the interconnection substrate 11 and the CFRP 18a as shown by an arrow in FIG. 6-(C), while being heated at a temperature of approximately 150° C. Thereby, the CFRP 18a in the form of a prepreg is hardened into a shape, such as a shape of a cap, which covers the outline of the semiconductor chip 14, and is bonded on the interconnection substrate 11.

Thereafter, the interconnection substrate 11 bonded to the molded and hardened CFRP 18a (the heat radiation plate 18 in the form of a sheet having a concave portion) is retrieved from the under mold 23a and 23b and the upper mold 24.

In the final step shown in FIG. 6-(D), the solder bump (external connection terminal) 19 is formed on the other side of the interconnection substrate 11 (a side opposite to the side to which the heat radiation plate 18 is bonded) so as to be electrically connected with the interconnection pattern 13 of the interconnection substrate 11, as in the step shown in FIG. 5-(C). The above-mentioned steps manufacture the semiconductor device 10 according to the present manufacturing method.

According to the present manufacturing method, in the heating and pressurizing processes shown in FIG. 6-(C), the CFRP 18a in a prepreg form acts as an adhesive. Therefore, the CFRP 18a in the form of a prepreg can be molded (hardened) and bonded on the interconnection substrate 11 at the same time. The present manufacturing method has simpler manufacturing steps than the manufacturing method shown in FIG. 4 and FIG. 5. Also, the present manufacturing method does not need the adhesive 17 as used in the manufacturing method shown in FIG. 4 and FIG. 5.

In the above-mentioned embodiment, the interconnection substrate 11 is described to be a flexible substrate comprising the insulating resin film, such as a polyimide resin film, and the interconnection pattern of copper (Cu) formed on the surface thereof. However, the interconnection substrate 11 is not limited to this embodiment. For example, a rigid substrate, such as a glass epoxy resin substrate or a glass BT resin substrate, which is generally used in a build-up multilayer interconnection substrate, may be used as the interconnection substrate 11.

Also, it is described in the above-mentioned embodiment that, in constructing the interconnection substrate 11, the interconnection pattern 13 is formed after the through hole TH is formed in the insulating base 12. However, depending on a type or a form of the insulating base 12, the through hole TH may be formed after the interconnection pattern 13 is formed.

Further, it is described in the above-mentioned embodiment that the solder bump 19 is used as the external connection terminal. However, a material or a form of the external connection terminal is not limited to this embodiment. For example, a gold (Au) bump may be substituted for the solder bump 19. Or else, the external connection terminal may be used in the form of a pin.

For example, in a case of using a T-shaped pin having a relatively large head portion as the external connection terminal, the pin is bonded as follows. First, a proper amount of solder paste is placed at a position, where the external connection terminal is to be formed, of the interconnection pattern 13 exposed from the under side of the insulating base 12 of the interconnection substrate 11. Next, the head portion of the T-shaped pin is placed on the solder paste. Then, the solder paste is hardened by reflowing so as to bond the pin.

The present invention is not limited to the specifically disclosed embodiments, and variations and modifications may be made without departing from the scope of the present invention.

The present application is based on Japanese priority application No.2000-014809 filed on Jan. 24, 2000, the entire contents of which are hereby incorporated by reference.

What is claimed is:

1. A manufacturing method of a semiconductor device, the method comprising:

a first step of preparing a heat-resistant resin containing carbon fibers in a form of a prepreg having a shape corresponding to an outline of a package;

a second step of molding said heat-resistant resin into a predetermined shape by heating and pressurizing said heat-resistant resin in a mold having a shape corresponding to an outline of a semiconductor element to be mounted;

a third step of mounting said semiconductor element on a substantially flat interconnection substrate having an interconnection pattern formed on a surface thereof so that an electrode terminal formed on a surface of said semiconductor element is electrically connected to said interconnection pattern;

a fourth step of applying an adhesive on a surface of said semiconductor element opposite to said surface on which said electrode terminal is formed and on said surface of said substantially flat interconnection substrate;

a fifth step of heating and pressurizing said heat-resistant resin placed on said surface of said substantially flat interconnection substrate in a mold having a shape corresponding to an outline of the package; and a sixth step of forming an external connection terminal on the other surface of said substantially flat interconnection substrate so as to penetrate through said substantially flat interconnection substrate and be electrically connected to said interconnection pattern.

2. The manufacturing method as claimed in claim 1, wherein, in said first step, said carbon fibers are woven so that the carbon fibers extend in a plurality of directions parallel to a surface of said substantially flat interconnection substrate.

* * * * *